(12) United States Patent
Pathak

(10) Patent No.: US 9,997,236 B1
(45) Date of Patent: Jun. 12, 2018

(54) READ ASSIST CIRCUIT WITH PROCESS, VOLTAGE AND TEMPERATURE TRACKING FOR A STATIC RANDOM ACCESS MEMORY (SRAM)

(71) Applicant: STMicroelectronics International N.V., Amsterdam (NL)

(72) Inventor: Abhishek Pathak, Nowgong (IN)

(73) Assignee: STMicroelectronics International N.V., Schiphol (NL)

( * ) Notice: Subject to any disclaimer, the term of this patent is extended or adjusted under 35 U.S.C. 154(b) by 0 days. days.

(21) Appl. No.: 15/375,390

(22) Filed: Dec. 12, 2016

(51) Int. Cl.
*G11C 11/00* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ....... G11C 11/419; G11C 11/417; G11C 5/06; G11C 5/14; G11C 8/08; G11C 7/14; G11C 11/413; G11C 17/18; G11C 7/04; G11C 7/06; G11C 7/08; G11C 7/22; G11C 7/222; G11C 7/227; G11C 11/41; G11C 2029/5002; G11C 29/06
USPC ... 365/154, 189.11, 210.1, 226, 194, 230.03, 365/230.06, 205
See application file for complete search history.

(56) References Cited

U.S. PATENT DOCUMENTS

| | | | |
|---|---|---|---|
| 8,755,239 B2 | 6/2014 | Holla et al. | |
| 2007/0030741 A1* | 2/2007 | Nii | G11C 5/06 365/189.11 |
| 2017/0301396 A1* | 10/2017 | Dhori | G11C 11/419 |

* cited by examiner

Primary Examiner — Thong Q Le
(74) Attorney, Agent, or Firm — Crowe & Dunlevy

(57) ABSTRACT

A memory circuit includes a wordline, memory cells connected to the wordline and a wordline driver circuit. The memory circuit further includes a read assist circuit including an n-channel pull-down transistor having a source-drain path connected between the wordline and a ground node. A bias circuit applies a biasing voltage to the gate terminal of the n-channel pull-down transistor that is modulated responsive to process, voltage and temperature conditions in order to provide controlled word line underdrive.

25 Claims, 4 Drawing Sheets

US 9,997,236 B1

READ ASSIST CIRCUIT WITH PROCESS, VOLTAGE AND TEMPERATURE TRACKING FOR A STATIC RANDOM ACCESS MEMORY (SRAM)

TECHNICAL FIELD

The disclosure relates to integrated memory circuits and in particular to a read assist circuit for a static random access memory (SRAM).

BACKGROUND

Reference is made to FIG. 1 which shows a schematic diagram of a standard memory circuit 10 including a plurality of memory cells 12 that are typically arranged in an array including plural columns and rows. Each memory cell 12 in this implementation is, for example, a conventional six transistor (6T) static random access memory (SRAM) cell 12. The memory circuit 10 further includes a wordline driver 14 for each row and an address decoder 16 configured to control operation of the wordline drivers.

Each memory cell 12 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QB. The cell 12 further includes two transfer (passgate) transistors 26 and 28 whose gate terminals are driven by a wordline (WL) that is coupled to an output of the wordline driver 14. Transistor 26 is source-drain connected between the true data storage node QT and a node associated with a true bitline (BLT). Transistor 28 is source-drain connected between the complement data storage node QB and a node associated with a complement bitline (BLB). The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, Gnd) at a low supply node. The high supply voltage Vdd at the high supply node and the low supply voltage Gnd at the low supply node comprise the power supply set of voltages for the cell 12.

The wordline driver circuit 14 includes a series connected p-channel and n-channel MOSFET transistor pair forming a logic inverter. The wordline driver circuit 14 is also coupled to receive the high supply voltage (Vdd) at the high supply node and is referenced to the low supply voltage (Gnd) at the low supply node. The input of the wordline driver circuit 14 is coupled to an output of the address decoder 16 and the wordline (WL) for a row of cells 12 is coupled to the output of the corresponding wordline driver circuit 14. The address decoder 16 receives an address (Addr), decodes the received address and selectively actuates the wordline through the wordline driver circuit 14.

The memory circuit 10 further includes a read assist circuit 40 coupled to each wordline (WL) or to pairs of wordlines. The functionality of the read assist circuit 40 is provided for use in read limited SRAM cells for operation at a supply voltage that is lower than a minimum functional voltage of the technology. One known technique for read assist is wordline lowering. In this technique, the wordline is pulled down by the read assist circuit 40 to a voltage lower than supply voltage in order to provide sufficient static noise margin (SNM) for the read and write operation. It will be noted that SNM varies with process, voltage and temperature (PVT), so it is important to track the word line underdrive (WLUD) voltage (a voltage lower than the wordline driver's high supply voltage Vdd) with PVT in order to achieve better power, performance and area (PPA) figures for the memory circuit.

The read assist circuit 40 as known in the art tracks wordline voltage lowering with process and temperature, but fails to track with respect to voltage. As SNM increases with increased supply voltage, this is an important factor not accounted for in prior art read assist circuits. Additionally, such tracking is important because the WLUD voltage increases as well with increased supply voltage, and thus can result in a slowdown of the read operation and also write failure. To protect against such a failure, there is an associated performance and power penalty and extra circuit architecture overhead.

There is accordingly a need in the art for an improved read assist circuit with process, voltage and temperature tracking capability.

SUMMARY

In an embodiment, a circuit comprises: a wordline configured to be coupled to a plurality of memory cells; a pull-down transistor having a source-drain path connected between the wordline and a ground node; and a bias circuit configured to apply a process, voltage and temperature dependent biasing voltage to a control terminal of the pull-down transistor to provide wordline underdrive during read assist.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
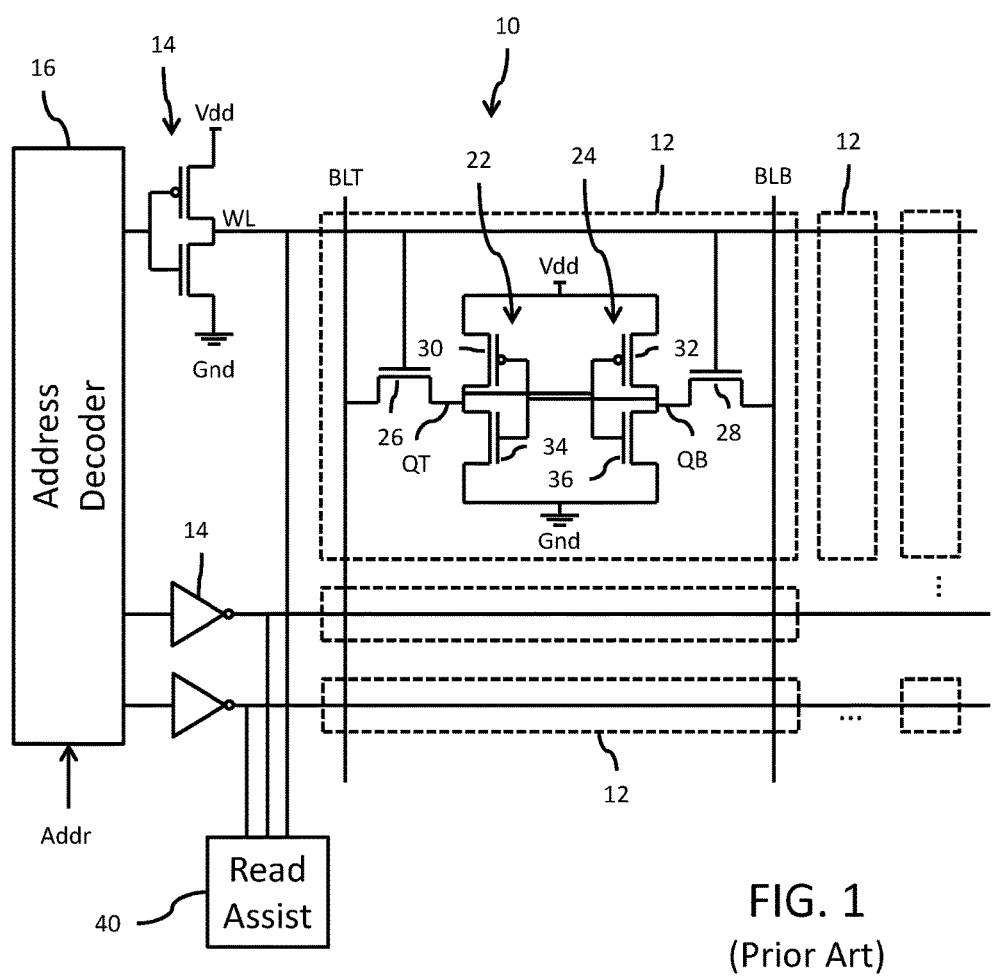
FIG. 1 is a schematic diagram of a standard memory circuit with read assist.
Figure 2:
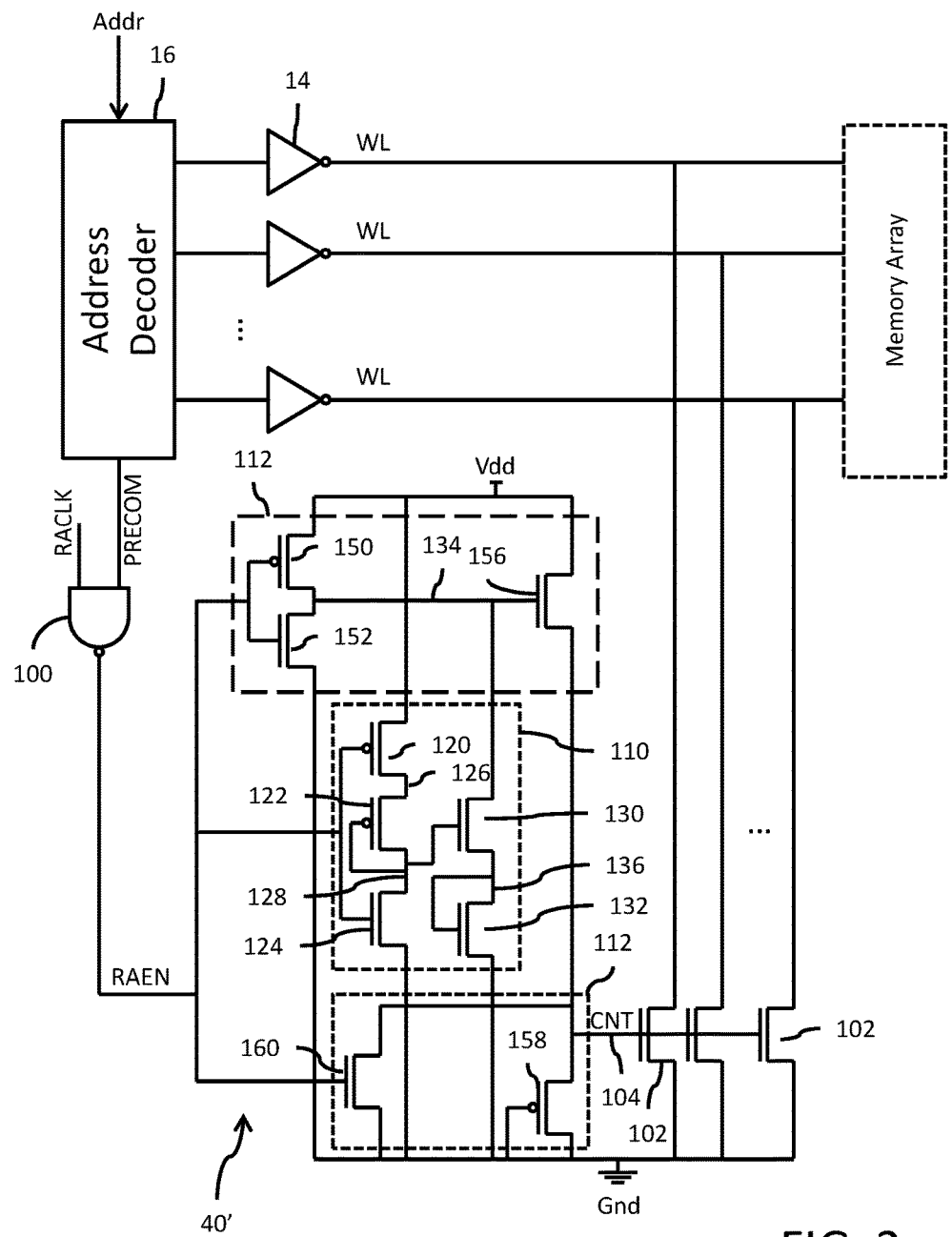
FIG. 2 is a schematic diagram of a read assist circuit with process, voltage and temperature tracking capability.
Figure 4:
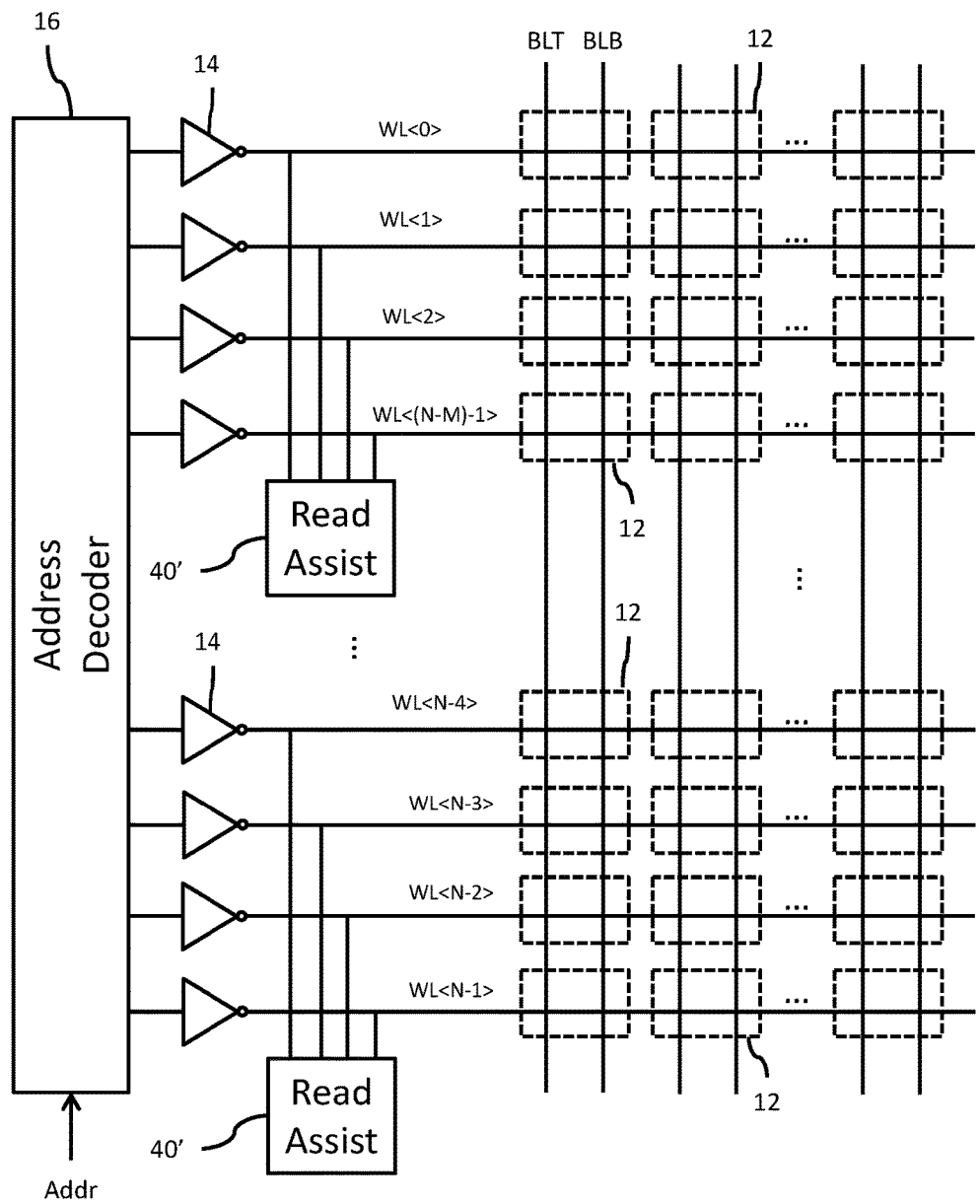
FIG. 4 is a block diagram showing use of multiple read assist circuits in a memory array.

Reference is now made to FIG. 2 which shows a schematic diagram of a read assist circuit 40' with process, voltage and temperature tracking capability. The circuit 40' may, for example, be used in place of the prior art read assist circuit 40 of FIG. 1. Thus, the circuit 40' is coupled to a plurality of wordlines (WL) that are coupled to the rows of a memory array including a plurality of memory cells (such as, for example, SRAM cells). In another way of implementation, circuit 40' can also be repeated for the pairs of wordline. For example, for N number of wordlines the circuit 40' is repeated M times and then N/M number of wordlines will be coupled to each circuit 40' of FIG. 2 (as shown in FIG. 4).

The read assist circuit 40' includes a logic circuit 100 having a first input coupled to receive a decoder select signal (PRECOM) output from the address decoder 16 and a second input configured to receive a read assist clock signal (RACLK) output from a clock generator circuit (not shown). The logic circuit 100 logically combines the decoder select signal and the read assist clock signal to generate a read assist enable signal (RAEN). In an embodiment, the logic circuit 100 comprises a logic NAND gate and thus the read assist enable signal RAEN is asserted logic low when read assist is enabled for operation (and, conversely, deasserted logic high when read assist is disabled). The logic low value of the read assist enable signal RAEN occurs when both the decoder select signal PRECOM and the read assist clock signal RACLK are logic high.

The read assist circuit 40' includes a plurality of n-channel pull down transistors 102. Each pull down transistor 102 has its source terminal coupled to the low supply voltage Gnd at the low supply node and its drain terminal coupled to one wordline (WL). The gate terminals of the pull down transistors 102 are coupled together at node 104 and driven by a control signal CNT.

The read assist circuit 40' includes a voltage tracking circuit 110 and a process and temperature tracking circuit 112. Each circuit 110 and 112 is configured to receive the read assist enable signal RAEN.

The voltage tracking circuit 110 includes a p-channel transistor 120, a p-channel transistor 122 and an n-channel transistor 124 whose source-drain paths are coupled in series between the high supply voltage (Vdd) at the high supply node and the low supply voltage Gnd at the low supply node. More specifically, the source terminal of transistor 120 is coupled to the high supply node and the drain terminal of transistor 120 is coupled to the source terminal of transistor 122 at node 126. The transistor 122 is configured as a diode-connected device with its gate terminal coupled to its drain terminal at node 128. The drain terminal of transistor 124 is also coupled to node 128, and the source terminal of transistor 124 is coupled to the low supply node. The gate terminals of transistors 120 and 124 are coupled to receive the read assist enable signal RAEN. The voltage tracking circuit 110 further includes an n-channel transistor 130 and an n-channel transistor 132 whose source-drain paths are coupled in series between a node 134 and the low supply node. More specifically, the drain terminal of transistor 130 is coupled to node 134 and the source terminal of transistor 130 is coupled to the drain terminal of transistor 132 at node 136. The transistor 132 is configured as a diode-connected device with its gate terminal coupled to its drain terminal at node 136. The source terminal of transistor 132 is coupled to the low supply node. The gate terminal of transistor 130 is coupled to node 128.

The process and temperature tracking circuit 112 includes a p-channel transistor 150 and an n-channel transistor 152 whose source-drain paths are coupled in series between the high supply node and the low supply node. More specifically, the source terminal of transistor 150 is coupled to the high supply node and the drain terminal of transistor 150 is coupled to the drain terminal of transistor 152 at node 134. The source terminal of transistor 152 is coupled to the low supply node. The gate terminals of transistors 150 and 152 are coupled to receive the read assist enable signal RAEN. The process and temperature tracking circuit 112 further includes an n-channel transistor 156 and a p-channel transistor 158 whose source-drain paths are coupled in series between the high supply node and the low supply node. More specifically, the drain terminal of transistor 156 is coupled to the high supply node and the source terminal of transistor 156 is coupled to the source terminal of transistor 158 at node 104. The gate terminal of transistor 156 is coupled to node 134. The transistor 158 is configured as a diode-connected device with its gate terminal coupled to its drain terminal at the low supply node. The process and temperature tracking circuit 112 still further includes an n-channel transistor 160 having a source-drain path coupled between the node 104 and the low supply node. More specifically, the drain terminal of transistor 160 is coupled to the node 104 and the source terminal of transistor 160 is coupled to the low supply node. The gate terminal of transistor 160 is coupled to receive the read assist enable signal RAEN.

The read assist circuit 40' operates to modulate the voltage level of the read assist control signal CNT at node 104 in order to achieve different WLUD performance across PVT ranges. The higher the modulated voltage of the control signal CNT, the greater the WLUD (and vice versa).

The need for WLUD from an SNM point of view is at maximum with respect to a fast NMOS/slow PMOS (FS) process corner. Conversely, the need for WLUD from an SNM point of view is at minimum with respect to a slow NMOS/fast PMOS (SF) process corner. The transistors 156 and 158 of the process and temperature tracking circuit 112 function to track the WLUD requirement across process corner. At the fast NMOS process corner, the process and temperature tracking circuit 112 causes the voltage at node 104 to settle more toward the high supply voltage (Vdd) at the high supply node due to the operation of n-channel transistor 156 causing an increase in the voltage level of the control signal CNT at node 104 to provide more WLUD. With respect to the fast PMOS corner, however, the process and temperature tracking circuit 112 causes the voltage at node 104 to settle more toward the low supply voltage Gnd at the low supply node due to the operation of p-channel transistor 158 so causing a decrease in the voltage level of the control signal CNT at node 104 to provide less WLUD.

The need for WLUD from an SNM point of view is at maximum for a higher temperature and at minimum for a lower temperature. The process and temperature tracking circuit 112 tracks the WLUD requirement over temperature change. When the read assist enable signal RAEN is logic low (i.e., read assist is enabled for operation), transistor 150 turns on and configures transistor 156 as a diode-connected transistor with its gate terminal coupled to its drain terminal at the high supply node. Because the transistor 156 is now configured as a diode-connected device, its threshold voltage will vary with change in temperature. As the temperature increases, the threshold voltage of transistor 156 decreases and the process and temperature tracking circuit 112 causes the voltage at node 104 to settle more toward the high supply voltage (Vdd) at the high supply node. Conversely, with decrease in temperature, the threshold voltage of transistor 156 increases and the process and temperature tracking circuit 112 causes the voltage at node 104 to settle more toward the low supply voltage Gnd at the low supply node.

The transistor 158 is designed for two purposes. One purpose is for process tracking. If the PMOS is at fast corner, transistor 158 adjusts the CNT signal to reduce WLUD. Conversely, if the PMOS is at slow corner, transistor adjusts the CNT signal to increase WLUD. Another purpose concerns temperature compensation with transistor 158 discharging node 104 close to ground level at the start of the read/write operation in order to avoid settling of node 104 at the Vdd level during a previous read/write operation or no operating condition. Since the transistor 156 is designed to track WLUD with varying NMOS process corner, that is the reason transistor 158 is also designed as a diode for the proper process tracking with NMOS and PMOS process corner.

The need for WLUD from an SNM point of view is at maximum for lower supply voltage and at minimum for higher supply voltage. The voltage tracking circuit 110 tracks the WLUD need over voltage change. When the read assist enable signal RAEN is logic high, the read assist is disabled. Transistor 124 is turned on to ground node 128 and turn off transistor 130. When the read assist enable signal RAEN transitions to logic low, the read assist is enabled for WLUD. Transistor 150 turns on to apply the supply voltage to the source terminal of transistor 130. Because transistor 132 is configured as a diode-connected device, the voltage at node 136 settles at the NMOS threshold voltage (Vtn). Because transistor 122 is configured as a diode-connected device, the voltage at node 128 settles at PMOS threshold voltage (Vtp) below Vdd (i.e., Vdd-Vtp). The gate overdrive voltage of transistor 130 is accordingly equal to Vdd-Vtp-Vtn-Vtn. With a relatively lower supply voltage, the voltage at node 128 is lower and transistor 130 will only weakly turn on. As a result, the voltage at node 134 will settle close to the high supply voltage Vdd to turn transistor 156 more strongly on and cause the voltage at node 104 to settle more toward the high supply voltage (Vdd) at the high supply node. With a relatively higher supply voltage, on the other hand, the voltage at node 128 is higher and transistor 130 will more strongly turn on. As a result, the voltage at node 134 will settle further away from the high supply voltage Vdd to turn transistor 156 less strongly on and cause the voltage at node 104 to settle more toward the low supply voltage Gnd at the low supply node.

Figure 3:
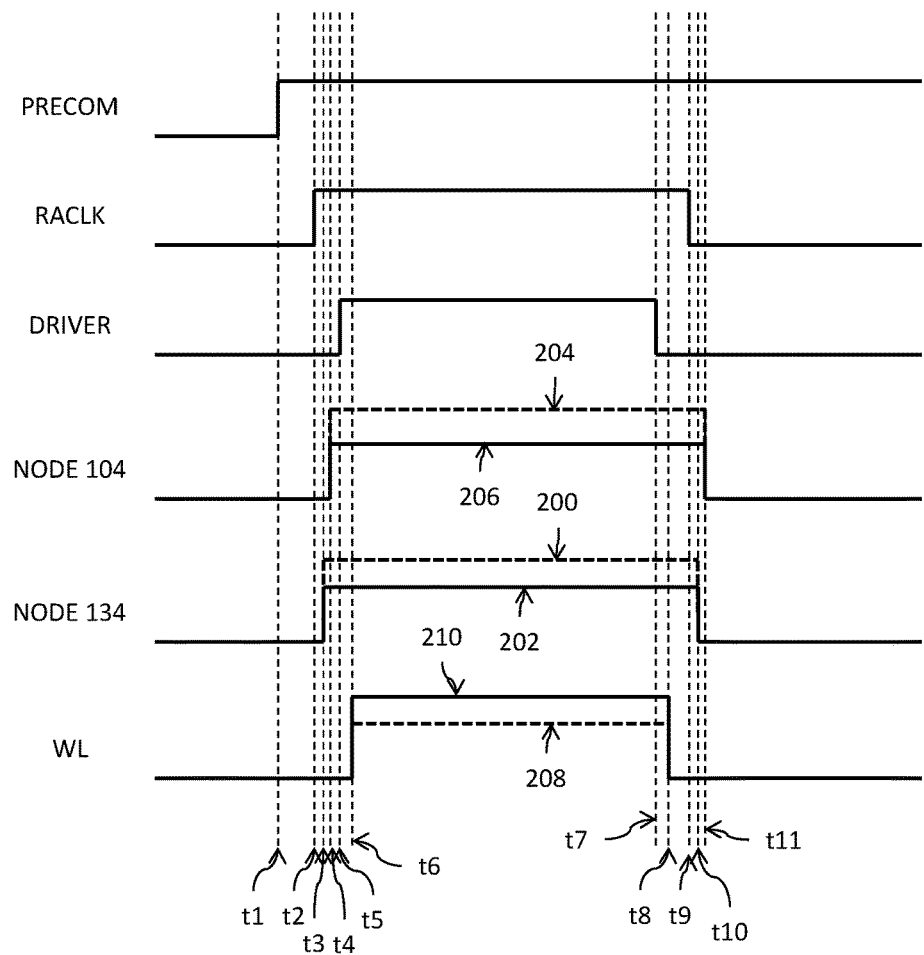
FIG. 3 shows operation waveforms for the read assist circuit of FIG. 2.

FIG. 3 shows signal waveforms for operation of the circuit 40'. At time t1, the decoder select signal PRECOM is asserted logic high indicating the selection of the desired row of memory cells in the memory array based on the address Addr. At time t2, the read assist clock signal RACLK is asserted logic high indicating the start of a read or write operation on the memory array and the output of logic circuit 100 changes to logic low and the read assist enable signal RAEN is asserted to enable operation of the read assist circuit 40'. At time t3, the voltage at node 134 settles to a value that tracks the supply voltage Vdd. For example, with respect to a relatively lower supply voltage, the voltage at node 134 will settle closer to the high supply voltage Vdd (reference 200). Conversely, with respect to a relatively higher supply voltage, the voltage at node 134 will settle closer to the ground supply voltage Gnd (reference 202). The voltage level at node 134 affects the turn on strength of transistor 156. At time t4, the voltage at node 104 settles to a value that tracks the supply voltage Vdd. For example, with respect to a relatively lower supply voltage, the voltage at node 104 will settle closer to the high supply voltage Vdd (reference 204). Conversely, with respect to a relatively higher supply voltage, the voltage at node 104 will settle closer to the ground supply voltage Gnd (reference 206). The voltage level at node 104 affects the turn on strength of transistor 102. At time t5, the address decoder enable the wordline driver 14. At time t6, the wordline voltage settles to a value to provide the correct WLUD with respect to supply voltage. For example, with respect to a relatively lower supply voltage, the transistor 102 turns on more strongly and the wordline voltage will settle closer to the ground supply voltage Gnd (reference 208). Conversely, with respect to a relatively higher supply voltage, the transistor 102 turns on less strongly and the wordline voltage will settle closer to the supply voltage Vdd (reference 210).

The WLUD voltage is applied for the duration of the read or write operation. At time t7, the address decoder disables the wordline driver 14. At time t8, the wordline driver terminates application of the wordline signal. At time t9, the read assist clock signal RACLK is deasserted (logic low) and the output of logic circuit 100 changes to logic high and the read assist enable signal RAEN is deasserted. This causes transistors 152 and 160 to turn on and force the voltage at nodes 134 and 104 to ground at times t10 and t11, respectively.

The memory is designed to operate at different supply ranges for the optimization of power and performance based on the need. At a relatively lower voltage range, the implementation of WLUD provides sufficient SNM to the memory cell. However, performance degrades due to lower WL level compared to Vdd. The memory operates at the lower voltage range in order to save the power consumption, and hence performance degradation is acceptable. For better performance, the memory is operated at higher voltage range. Once a read-assist circuit without voltage tracking is tuned for WLUD at the lower voltage range according to the need of SNM, the same tuning cannot track required WLUD as the memory operating voltage increases. Furthermore, due to unnecessary greater WLUD at the higher voltage range, the memory ends up losing performance and power. In other words, the write and read operation has to be performed for longer duration due to lower WL voltage than Vdd. Implementing voltage tracking along with process and temperature tracking in read assist circuitry helps the memory to achieve better PPA across wide operating voltage range.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
  a wordline configured to be coupled to a plurality of memory cells;
  a pull-down transistor having a source-drain path connected between the wordline and a ground node; and
  a bias circuit configured to apply a biasing voltage to a control terminal of the pull-down transistor to provide wordline underdrive in response to assertion of a read assist control signal, wherein the bias circuit comprises:
    a first n-channel transistor coupled between a positive supply voltage node and the control terminal of the pull-down transistor;
    a diode-connected first p-channel transistor coupled between the control terminal of the pull-down transistor and the ground node; and
    a switching circuit configured to connect the first n-channel transistor in a diode-connected configuration in response to assertion of the read assist control signal.

2. The circuit of claim 1, further comprising a wordline driver circuit including a p-channel pull-up transistor, said pull-down transistor being an n-channel transistor.

3. The circuit of claim 1, wherein the switching circuit is further configured to connect a control terminal of the first n-channel transistor to the ground node in response to deassertion of the read assist control signal.

4. The circuit of claim 1, wherein the bias circuit further comprises:
  a second n-channel transistor and a diode-connected third n-channel transistor coupled in series between a control terminal of the first n-channel transistor and the ground node; and a diode-connected second p-channel transistor; and
a further switching circuit configured to selectively couple the diode-connected second p-channel transistor between the positive supply voltage node and a control terminal of the second n-channel transistor in response to assertion of the read assist control signal.

5. The circuit of claim 1, further comprising:
a further wordline configured to be coupled to a further plurality of memory cells;
a further pull-down transistor having a source-drain path connected between the further wordline and the ground node; and
wherein the biasing voltage is applied to both the control terminal of the pull-down transistor and a control terminal of the further pull-down transistor.

6. A circuit, comprising:
a wordline configured to be coupled to a plurality of memory cells;
a pull-down transistor having a source-drain path connected between the wordline and a ground node; and
a bias circuit configured to apply a biasing voltage to a control terminal of the pull-down transistor to provide wordline underdrive in response to assertion of a read assist control signal, wherein the bias circuit comprises:
a first transistor coupled between a first supply voltage node and the control terminal of the pull-down transistor;
a diode-connected second transistor coupled between the control terminal of the pull-down transistor and the ground node; and
a switching circuit configured to connect the first transistor in a diode-connected configuration in response to assertion of the read assist control signal.

7. The circuit of claim 6, wherein the bias circuit further comprises:
a third transistor and diode-connected fourth transistor coupled in series between a control terminal of the first transistor and one of the first supply voltage and ground nodes;
a diode-connected fifth transistor; and
a further switching circuit configured to selectively couple the diode-connected fifth transistor between one of the first supply voltage and ground nodes and a control terminal of the third transistor in response to assertion of the read assist control signal.

8. The circuit of claim 6, further comprising a wordline driver circuit including a p-channel pull-up transistor, said pull-down transistor being an n-channel transistor.

9. The circuit of claim 6, further comprising:
a further wordline configured to be coupled to a further plurality of memory cells;
a further pull-down transistor having a source-drain path connected between the further wordline and the ground node; and
wherein the biasing voltage is applied to both the control terminal of the pull-down transistor and a control terminal of the further pull-down transistor.

10. A circuit, comprising:
a wordline configured to be coupled to a plurality of memory cells;
a pull-down transistor having a source-drain path connected between the wordline and a ground node; and
a bias circuit configured to apply a biasing voltage to a control terminal of the pull-down transistor to provide wordline underdrive in response to assertion of a read assist control signal, wherein the bias circuit comprises:
a first transistor coupled between a positive supply voltage node and the control terminal of the pull-down transistor; and
means for modulating a voltage on a control terminal of said first transistor so that said transistor operates during read assist to pull the biasing voltage toward the ground node in response to increase in a supply voltage at said positive supply voltage node and further permit the process, voltage and temperature dependent biasing voltage to move toward the positive supply voltage node in response to a decrease in the supply voltage, wherein said means for modulating comprises:
a second transistor and diode-connected third transistor coupled in series between the control terminal of the first transistor and the ground node; and
a diode-connected fourth transistor selectively coupled between the positive supply voltage node and a control terminal of the second transistor during read assist.

11. The circuit of claim 10, further comprising a wordline driver circuit including a p-channel pull-up transistor, said pull-down transistor being an n-channel transistor.

12. The circuit of claim 10, further comprising:
a further wordline configured to be coupled to a further plurality of memory cells;
a further pull-down transistor having a source-drain path connected between the further wordline and the ground node; and
wherein the biasing voltage is applied to both the control terminal of the pull-down transistor and a control terminal of the further pull-down transistor.

13. A circuit, comprising:
a wordline configured to be coupled to a plurality of memory cells;
a pull-down transistor having a source-drain path connected between the wordline and a ground node; and
a bias circuit configured to apply a biasing voltage to a control terminal of the pull-down transistor to provide wordline underdrive in response to assertion of a read assist control signal, wherein the bias circuit comprises:
a first n-channel transistor coupled between a positive supply voltage node and the control terminal of the pull-down transistor;
a second n-channel transistor and a diode-connected third n-channel transistor coupled in series between a control terminal of the first n-channel transistor and the ground node;
a diode-connected p-channel transistor; and
a switching circuit configured to selectively couple the diode-connected p-channel transistor between the positive supply voltage node and a control terminal of the second n-channel transistor in response to assertion of the read assist control signal.

14. The circuit of claim 13, further comprising a further switching circuit configured to connect the first n-channel transistor in a diode-connected configuration in response to assertion of the read assist control signal.

15. The circuit of claim 14, wherein the switching circuit is further configured to connect a control terminal of the first n-channel transistor to the ground node in response to deassertion of the read assist control signal.

16. The circuit of claim 13, further comprising:
a further wordline configured to be coupled to a further plurality of memory cells;

a further pull-down transistor having a source-drain path connected between the further wordline and the ground node; and wherein the biasing voltage is applied to both the control terminal of the pull-down transistor and a control terminal of the further pull-down transistor.

17. The circuit of claim 13, further comprising a wordline driver circuit including a p-channel pull-up transistor, said pull-down transistor being an n-channel transistor.

18. A circuit, comprising:
a wordline configured to be coupled to a plurality of memory cells;
a pull-down transistor having a source-drain path connected between the wordline and a ground node; and
a bias circuit configured to apply a biasing voltage to a control terminal of the pull-down transistor to provide wordline underdrive in response to assertion of a read assist control signal, wherein the bias circuit comprises:
a first transistor coupled between a first supply voltage node and the control terminal of the pull-down transistor; and
a switching circuit configured to connect the first transistor in a diode-connected configuration in response to assertion of the read assist control signal and connect a gate of the first transistor and the control terminal of the pull-down transistor to the ground node in response to deassertion of the read assist control signal.

19. The circuit of claim 18, further comprising a wordline driver circuit including a p-channel pull-up transistor, said pull-down transistor being an n-channel transistor.

20. The circuit of claim 18, further comprising:
a further wordline configured to be coupled to a further plurality of memory cells;
a further pull-down transistor having a source-drain path connected between the further wordline and the ground node; and
wherein the biasing voltage is applied to both the control terminal of the pull-down transistor and a control terminal of the further pull-down transistor.

21. A circuit, comprising:
a wordline configured to be coupled to a plurality of memory cells;
a pull-down transistor having a source-drain path connected between the wordline and a ground node; and
a bias circuit configured to apply a biasing voltage to a control terminal of the pull-down transistor to provide wordline underdrive in response to assertion of a read assist control signal, wherein the bias circuit comprises:
a first n-channel transistor coupled between a positive supply voltage node and the control terminal of the pull-down transistor;
a second n-channel transistor coupled in between a control terminal of the first n-channel transistor and the ground node;
a diode-connected p-channel transistor; and
a switching circuit configured to selectively couple the diode-connected p-channel transistor between the positive supply voltage node and a control terminal of the second n-channel transistor in response to assertion of the read assist control signal.

22. The circuit of claim 21, further comprising a further switching circuit configured to connect the first n-channel transistor in a diode-connected configuration in response to assertion of the read assist control signal.

23. The circuit of claim 22, wherein the switching circuit is further configured to connect a control terminal of the first n-channel transistor to the ground node in response to deassertion of the read assist control signal.

24. The circuit of claim 21, further comprising:
a further wordline configured to be coupled to a further plurality of memory cells;
a further pull-down transistor having a source-drain path connected between the further wordline and the ground node; and
wherein the biasing voltage is applied to both the control terminal of the pull-down transistor and a control terminal of the further pull-down transistor.

25. The circuit of claim 21, further comprising a wordline driver circuit including a p-channel pull-up transistor, said pull-down transistor being an n-channel transistor.

* * * * *